(12) United States Patent
Montano et al.

(10) Patent No.: US 6,372,055 B1
(45) Date of Patent: Apr. 16, 2002

(54) METHOD FOR REPLENISHING BATHS

(75) Inventors: Joseph R. Montano, Boston; Kimberly B. Wynja, Worcester; Edward C. Couble, Brockton; Martin W. Bayes, Hopkinton, all of MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/511,543

(22) Filed: Feb. 23, 2000

Related U.S. Application Data

(60) Provisional application No. 60/162,403, filed on Oct. 29, 1999.

(51) Int. Cl.$^7$ .............................................. C23C 22/48
(52) U.S. Cl. ....................................... 148/269; 148/282
(58) Field of Search .................................. 148/269, 282

(56) References Cited

U.S. PATENT DOCUMENTS

| | | |
|---|---|---|
| 5,352,350 A | 10/1994 | Andricacos et al. |
| 5,800,859 A | 9/1998 | Price et al. |
| 5,869,130 A | 2/1999 | Ferrier |

FOREIGN PATENT DOCUMENTS

| | | | |
|---|---|---|---|
| GB | 2 203 387 A | | 10/1988 |
| WO | WO-96/19097 A1 | * | 6/1996 |

* cited by examiner

Primary Examiner—John Sheehan
Assistant Examiner—Andrew L. Oltmans
(74) Attorney, Agent, or Firm—S. Matthew Cairns

(57) ABSTRACT

Disclosed are methods for replenishing adhesion promoting baths from an unstable state without discarding the bath. Methods of adhesion promoting substrates, such as printed wiring boards, using the replenished baths are also disclosed.

14 Claims, No Drawings

METHOD FOR REPLENISHING BATHS

This application claims the benefit of U.S. Provisional Application No. 60/162,403 filed Oct. 29, 1999.

BACKGROUND OF THE INVENTION

This invention relates generally to adhesion promoting baths. In particular, this invention relates to a method for replenishing adhesion promoting baths for use in circuit board manufacture.

Multilayer printed circuit boards are used for a variety of electrical applications and provide the advantage of conservation of weight and space. A multilayer board is comprised of two or more circuit layers, each circuit layer separated from another by one or more layers of dielectric material. Circuit layers are formed by applying a copper layer onto a polymeric substrate. Printed circuits are then formed on the copper layers by techniques well known to the art, for example print and etch to define and produce the circuit traces—i.e., discrete circuit lines in a desired circuit pattern. Once the circuit patterns are formed, a stack is formed comprising multiple circuit layers separated from each other by a dielectric layer, typically epoxy or epoxy/glass. Once the stack is formed, it is subjected to heat and pressure to form the laminated multilayer circuit board.

Following lamination, the multiple circuit layers are electrically connected to each other by drilling through holes through the board surface. Resin smear from through-hole drilling is removed under rather stringent conditions, for example, by treatment with a concentrated sulfuric acid or hot alkaline permanganate solution. Thereafter, the through-holes are further processed and plated to provide a conductive interconnecting surface.

Prior to lamination and through hole formation, the discrete copper circuit lines are typically treated with an adhesion promoter to improve bond strength between each circuit layer and adjacent interleaving dielectric resin layers. One method used in the art to improve bond strength involves treatment of the circuit layer with compositions containing an acid, an oxidant, a corrosion inhibitor and typically one or more additional components to provide a micro-roughened, conversion coated surface. Such micro-roughened and conversion coated surfaces enhance adhesion and wettability to the adjacent insulating layer by a mechanism that is believed to include mechanical interlocking between the metal surface and a dielectric resin layer. Metal surfaces that have been micro-etched, but not conversion coated do not generally possess as high a degree of surface roughness and texture, as can be inferred from their greater reflection of visible light or from scanning electron micrographs.

The adhesion promotion baths may be run horizontally or vertically and are typically run continuously. During continuous operation of the bath, the components of the bath are depleted and makeup components are added periodically. In order to provide the appropriate conversion coated surface, the makeup components must be added in amounts sufficient to maintain the components of the bath within a given range and ratio to each other. Typically, makeup solutions are provided which contain mixtures of the bath components in predetermined amounts and ratios. As the adhesion promotion bath is run, precipitation of material from solution may occur. Such precipitate may be removed by various methods, such as filtration. The makeup solutions generally account for components depleted due to such precipitate formation.

Periodically, the adhesion promotion bath must be shut down for a period of time, such as for 6 to 12 hours or over a weekend. During such a shut down, a failure of the bath may occur, i.e. an amount of precipitate may form that far exceeds the normal level. Such bath failure is more likely to occur when the copper concentration is greater than about 10 grams per liter. When such a bath is started up again after such a shut down, makeup solutions are typically added, however the resulting coatings often have unacceptable color and peel strength. At this point, the bath is usually discarded and a fresh bath is prepared, which greatly adds to the time and cost of the process.

In U.K Patent Application No. 2,203,387, a copper etching process is described with an etch bath regeneration step. A hydrogen peroxide etching composition comprising stabilizers for the peroxide, sulfuric acid and less than about 0.2% of an organic additive selected from ethylene glycol, propylene glycol and gum arabic. The organic additive functions to control the crystallization of copper sulfate on the sides of the etchant bath during cooling of the bath.

U.S. Pat. No. 5,800,859 (Price et al.) discloses a method for providing a micro-roughened conversion coated metal surface by contacting the metal surface with an adhesion promoting composition containing hydrogen peroxide, an inorganic acid, an organic corrosion inhibitor and a surfactant. Price et al. do not disclose the need for replenishing adhesion promoting baths, nor the problem of bath failures on start up after an extended shut down.

U.S. Pat. No. 5,352,350 (Andricacos et al.) discloses a method for maintaining a constant chemical composition in solutions used for wet chemical processing, particularly plating baths, i.e. a steady state maintenance of the baths. Such method performs a material balance on each component using the stoichiometry of chemical reactions in the bath to predict the amount of each component consumed and then adding a predicted amount of each component to the bath. This patent does not recognize the problem of bath failure on start up after an extended shut down.

Thus, there is a need for extending the service life of adhesion promoting baths that allows for easy start up of a bath after an extended shut down without the need to prepare a new bath.

SUMMARY OF THE INVENTION

It has been surprisingly found that adhesion promoting baths can be replenished, or their service life extended, following a failure upon start up of the bath after an extended shut down by the addition of a sufficient amount of corrosion inhibitor.

In one aspect, the present invention provides a method of replenishing an adhesion promoting bath including an acid, an oxidizer, a corrosion inhibitor and optionally, one or more additional components, after an extended shut down, including the steps of adjusting the concentration of acid, oxidant and optional components to working levels and adding a sufficient amount of corrosion inhibitor to provide conversion coated substrate surfaces having sufficiently dark color and peel strength.

In a second aspect, the present invention provides a method for providing a micro-roughened conversion coated metal surface comprising contacting the metal surface with the replenished adhesion promoting bath described above.

DETAILED DESCRIPTION OF THE INVENTION

As used throughout this specification, the following abbreviations shall have the following meanings, unless the context clearly indicates otherwise: g=gram; mg=milligram; mL=milliliter; L=liter; DI=deionized; C=Centigrade; lbf=pound force; in=inch; psi=pounds per square inch; ppm=parts per million; and wt %=percent by weight.

The term "alkyl" refers to linear, branched and cyclic alkyl. "Halide" refers to fluoride, chloride, bromide, and iodide. The terms "printed circuit board" and "printed wiring board" are used interchangeably throughout this specification. All amounts are percent by weight and all ratios are by weight, unless otherwise noted. All numerical ranges are inclusive.

The present invention is directed to a method of replenishing or rejuvenating an adhesion promoting bath after a failure event. The term "failure" or "failure event" refers to the start up of an adhesion promoting bath after an extended shut down period where the resulting metal surfaces do not have sufficiently dark color or peel strength to be useful in the printed wiring board industry.

In general, the etching and adhesion promoting baths of the present invention comprise oxidizer, acid, corrosion inhibitor, and optionally one or more additional components. It is preferred that the adhesion promoting baths of the present invention contain oxidizer, acid, corrosion inhibitor and at least one additional component selected from amines, surfactants and sources of halide ions.

Suitable oxidizers are any which are capable of oxidizing the surface of the metal or substrate in the matrix of the bath. Hydrogen peroxide is preferred. The oxidizers useful in the present invention are generally commercially available.

The amount of oxidizer is typically in the range of from 6 to 60 grams per liter and preferably from 12 to 30 grams per liter. It will be appreciated by those skilled in the art that the exact amount of oxidizer used depends upon the type of bath employed as well as the type and amounts of other components used.

Any acid which is stable in the matrix of the bath is suitable for use in the present invention and may be organic or inorganic. Suitable acids include, but are not limited to mineral acids. It is preferred that the mineral acid is selected from sulfuric acid, nitric acid, phosphoric acid, and hydrochloric acid. Sulfuric acid is particularly preferred. The acid useful in the present invention are generally commercially available.

The amount of acid useful in the baths of the present invention is typically in the range of from 5 to 360 grams per liter, and preferably 60 to 110 grams per liter. It will be appreciated by those skilled in the art that the exact amount of acid used depends upon the type of bath employed as well as the type and amounts of other components used.

The corrosion inhibitors useful in the present invention are any that effectively reacts with the substrate surface to form a protective complex layer. Suitable corrosion inhibitors include, but are not limited to triazoles, benzotriazoles, tetrazoles, imidazoles, benzimidazoles, and mixtures thereof. The corrosion inhibitors may optionally be substituted. Suitable substituents include ($C_1$–$C_4$)alkyl, amino, ($C_1$–$C_4$)alkylamino, ($C_1$–$C_4$)dialkylamino, and the like. It is preferred that the corrosion inhibitor is a ($C_1$–$C_4$)alkyl substituted or unsubstituted triazole or benzotriazole. Benzotriazole is particularly preferred. It will be appreciated by those skilled in the art that more than one corrosion inhibitor may be used advantageously in the present invention. The corrosion inhibitors useful in the present invention are generally commercially available.

The amount of corrosion inhibitor in the baths of the present invention is typically in the range of from 1 to 20 grams per liter, and preferably 6 to 12 grams per liter. It will be appreciated by those skilled in the art that the exact amount of corrosion inhibitor used depends upon the type of bath employed as well as the type and amounts of other components used.

Suitable additional components include, but are not limited to: amines, surfactants, stabilizers for the oxidant, water soluble polymers, sources of halide ions, and the like. Preferred additional components are amines, surfactants and sources of halide ions.

The amines useful in the baths of the present invention include, but are not limited to: primary amines, secondary amines, tertiary amines, quaternary ammonium compounds that are free of substituents having surfactant properties, and the like. The amines may be cloaliphatic or aromatic. Suitable amines include, but are not limited to.: methylamine, dimethylamine, trimethylamine, ethylamine, triethylamine, tripropylamine, i-propylamine, triallylamine, n-butylamine, t-butylamine, n-amylamine, cyclohexylamine, dicyclohexylamine, tetramethylammonium hydroxide, tetraethylammonium hydroxide, dimethyl diethylammonium hydroxide, tetrabutylammonium hydroxide, tetramethylammonium chloride, tetraethylammonium chloride, dimethyl diethylammonium chloride, and tetrabutylammonium chloride. Such amines are generally commercially available. When amines are used in the adhesion promoting baths of the present invention, they are typically present in an amount of from 0.01 to 2.5 wt %, and preferably from 0.1 to 1.0 wt %.

Any surfactant may be used in the baths of the present invention. It is preferred that the surfactant is cationic and more preferably a quaternary ammonium surfactant. When a quaternary ammonium surfactant is used, it is preferred that it contain one or more ethoxylated fatty amines. Suitable surfactants have at least one, preferably two, hydroxy lower alkyl groups, that is ($C_1$–$C_4$)hydroxyalkyl, and one or, less preferably, two lower alkyl, that is ($C_1$–$C_4$)alkyl groups, attached to the nitrogen atom. Particularly preferred quaternary ammonium surfactants are isodecyloxypropyl dihydroxyethyl methyl ammonium chloride and isotridecyloxypropyl dihydroxyethyl methyl ammonium chloride.

Surfactants may be advantageously used in both the etching and adhesion promoting baths of the present invention, and preferably in the adhesion promoting baths. When a surfactant is used in the baths of the present invention, it is typically present in an amount of at least 0.001 wt %, preferably at least 0.005 wt %, and more preferably at least 0.01 wt %. In general, the surfactant will be present in the bath composition in an amount no greater than 5 wt %, preferably no greater than 3 wt %, and more preferably no greater than 2.5 wt %. Thus, the surfactant is typically present in an amount in the range of 0.001 to 5 wt %, preferably 0.005 to 3 wt %, and more preferably 0.01 to 2.5 wt %. When used in an adhesion promoting bath, it is preferred that the amount of surfactant is less than the amount of corrosion inhibitor on a weight percentage basis. It has been found that if the concentration of the surfactant is increased above 5 wt % in adhesion promoting baths, the microroughened surface of the substrate which forms the good adhesion promotion lacks uniformity so that good adhesion may not be provided over the entire surface of the substrate.

Suitable oxidant stabilizers are any which stabilize the oxidant in the bath matrix. Examples of suitable oxidants include those for stabilizing hydrogen peroxide, such as dipicolinic acid, diglycolic and thiodiglycolic acid, ethylene diamine tetra-acetic acid and its derivatives, magnesium salt of an aminopolycarboxylic acid, sodium silicate, phosphates, phosphonates, sulfonates, and the like. The oxidant stabilizers useful in the baths are generally commercially available or are well known in the literature.

When oxidant stabilizers are used in the baths of the present invention, they are typically used in an amount of at least 0.001 wt %, and preferably 0.005 wt %, based on the weight of the adhesion promotion composition. In general, the oxidant stabilizer will not be present in an amount greater than 5 wt %, and preferably less than 1 wt %, based on the weight of the adhesion promotion composition.

The water soluble polymers useful in the present invention are any that are not wetting agents or surfactants, but are instead water soluble homopolymers or copolymers of low molecular weight water soluble monomers. Suitable water soluble polymers include, but are not limited to: ethylene oxide polymers, ethylene oxide-propylene oxide copolymers, polyethylene glycols, polypropylene glycols, polyvinyl alcohols and mixtures thereof. Preferred water soluble polymers are ethylene oxide polymers and polyethylene glycols, such as those sold by Union Carbide (Danbury, Conn.) under the Carbowax tradename. Particularly useful water soluble polymers are Carbowax 750 and Carbowax MPEG 2000. Also particularly useful are the ethylene oxide polymers and ethylene oxide-propylene oxide copolymers available from BASF (Ludwigshafen, Germany) under the Pluronic tradename. When used in the baths of the present invention, the water soluble polymer is typically present in an amount in the range of 1 to 15 grams per liter, and preferably from 3 to 6 grams per liter.

Any compound which provides halide ions to the bath matrix is suitable for use in the present invention. Suitable sources of halide ions include, but are not limited to alkaline earth salts, such as sodium chloride and potassium chloride, oxohalides, such as sodium chlorate or potassium chlorate, and halide bearing mineral acids, such as hydrochloric acid. It is preferred that the halide is chloride. Such sources of halide ions are readily commercially available. The concentration of the source of halide ions is typically in the range of 5 to 500 mg per liter, and preferably 10 to 50 mg per liter, all based on the halide ion content.

The baths of the present invention may be prepared by combining the oxidizer, acid, corrosion inhibitor and one or more additional components in an aqueous solution. It is preferred that DI water is used. When hydrogen peroxide is used, it is typically added in diluted form. The components of the bath are then mixed by any known means, such as stirring, swirling or agitation, followed by filtration if needed.

In use, a substrate surface, such as copper or a copper alloy, is cleaned by mechanical or chemical cleaning and then contacted with the adhesion promoter. The substrate surface may have previously been provided with a tarnish-inhibiting coating e.g. by incorporating the tarnish inhibitor into a resist stripping composition used in an immediately preceding step of etch resist stripping. Tarnish inhibitors used in such strippers are, for example a triazole or other coating. If so, it may be desirable to preclean the copper surface with a pre-cleaner before contact with the oxide forming composition. In a preferred embodiment of the invention, the surface is treated with a cleaner, followed by a pre-dip to prepare the surface and then the surface is contacted with the adhesion promotion bath.

Contact with the adhesion promotion composition may be by any conventional means, for example, by immersion in a bath of the adhesion promotion composition or by spraying or any other means of contact. The adhesion promotion baths may be run horizontally or vertically. Contact may be as part of a continuous process. The treatment is at a temperature desirably not exceeding 75° C. and more preferably, at a temperature varying between 20° C. and 50° C. Contact time is at least 1 second and preferably between 5 seconds and 2 minutes though the maximum contact time may be up to 10 minutes. A contact time of about 1 minute or less than 1 minute is particularly preferred.

The adhesion promoting bath may be continuously run at a variety of levels of copper in the bath, e.g. from less than 10 grams per liter to about 20 grams per liter or greater. Such continuously run baths may be achieved by a bleed and feed process, where an amount of the bath is continuously or periodically removed and corresponding amount of makeup components are added to compensate for the loss of material during such bleeding or bailout. It is preferred that the bath be run at the highest level of copper possible. The higher the copper concentration can be run in a steady state mode, the smaller the volume of solution that must be removed to maintain a given copper concentration and the smaller the amount of additional makeup material required. It will be appreciated by those skilled in the art that this would correspond to more economical usage of adhesion promoting baths. One advantage of the present invention is that such adhesion promoting baths may be continuously and economically run at very high levels of copper, such as from about 12 to about 25 grams per liter, without the need to dump and remake such baths on a periodic basis.

Continuously running adhesion promoting baths may periodically be stopped for short periods of time, such as for up to 2 hours. Such intermittent, short shut downs can occur, for example, when the production line backs up. Adhesion promoting bath failures generally do not occur with such short shut downs of the process. Longer shut downs occur at the end of production runs or at the end of a work week. Such longer shut downs are in the range of about 6 to 48 hours or longer, particularly about 12 to 24 hours. Adhesion promoting baths that are continuously run at copper concentrations greater than about 10 grams per liter, such as in the range of about 12 to 20 grams per liter, are prone to bath failure after such long shut downs. Such failed baths contain a much greater amount of precipitate after shut down than was present in the bath just prior to shut down. Failed baths still provide conversion coated metal surfaces, however such surfaces suffer from being light in color, e.g. pink instead of the typical dark brown, and from having reduced peel strength. This results in a rejected innerlayer and will ruin the printed wiring board.

Makeup solutions that are used to maintain the concentration of the components depleted while the bath is continuously in operation do not function to replenish such failed baths. For example, an adhesion promoting bath operating at approximately 15 grams per liter copper will have a certain amount of precipitate formed during continuous operation. After 12 hours of shut down, the amount of precipitate is greatly increased. At start up of the bath, replenishment solutions of the bath components are added and printed wiring boards are adhesion promoted. Such replenishment solutions are typically added based on analysis of the concentration of acid, oxidizer and/or the substrate surface area throughput of the bath. Such replenishment of the bath does not provide a bath within an operating range capable of providing desired results. For example, boards contacted with a bath replenished by the above approach are typically lighter in color, have a less uniform coating and exhibit reduced peel strength as compared to the boards treated just prior to such extended shut down. As a result, the adhesion promoting bath is typically discarded and a fresh bath prepared.

It has been surprisingly found that adhesion promoting baths operating at high levels of copper may be replenished after long or extended shut down periods by making the typical replenishment additions and in addition, a sufficient amount of corrosion inhibitor to provide conversion coated surfaces having acceptably dark and uniform color and peel strength. The present invention is particularly useful for adhesion promoting baths where the level of copper is from greater than 10 to about 20 grams per liter. Preferably, the conversion coated surfaces of the present invention are brown to dark brown in color. The change in color of conversion coated surfaces from brown or dark brown to maroon to light pink colored surfaces is unacceptable. It will be appreciated by those skilled in the art that the peel strength is dependent on the thickness of the metal foil tested, the nature of the laminate material to which the foil is bonded, and the lamination conditions, such as temperature, pressure and time, used to perform the lamination. For example, using 1.4 mil thick foil laminated to multifunctional FR-4 material, the peel strength is typically in the range of 3 to 6 $lbf/in^2$. It is preferred that the peel strength is as high as possible.

In the process of the present invention, it is preferred that the bath replenishment solutions are added first, followed by an additional amount of corrosion inhibitor. It is further preferred that the corrosion inhibitor be in the form of an acidic aqueous solution. Any acid may be used to acidify the corrosion inhibitor. Preferably, the acid is the same acid used in the bath, and more preferably the acid is sulfuric acid. It is preferred that the amount of acid in the aqueous corrosion inhibitor solution be sufficient to ensure solubility of the corrosion inhibitor but not so high as to lead to substantial changes in the acidity of the bath upon addition. Any corrosion inhibitor or mixtures of corrosion inhibitors may be added according to the present invention. It is preferred that the corrosion inhibitor added after an extended shut down is the same corrosion inhibitor used to prepare the bath initially.

The exact amount of corrosion inhibitor added will depend on the particular components of the bath and their concentrations, as well as the equipment used, such as a horizontal or vertical bath, and on the level of copper at which the bath is operated. One skilled in the art would be able to determine the level of corrosion inhibitor needed according to the present invention. A particularly useful amount of corrosion inhibitor is that amount sufficient to provide 8 to 12 grams per liter in the bath, and more particularly 8 to 10 grams per liter. The level of corrosion inhibitor can be determined by direct analysis of the bath or by visual evaluation of the resultant conversion coated surfaces. Suitable direct analyses include UV spectrophotometry, HPLC and the like.

The method of the present invention is useful in all adhesion promoting baths containing acid, oxidizer and corrosion inhibitor operating in a steady state mode that experiences a extended shut down period. It will be appreciated by those skilled in the art that the present invention may be advantageously used in baths running in a batch mode. Once adhesion promoting baths are replenished according to the present invention, they may be maintained by using the typical makeup solutions until the next extended shut down period, after which the bath may need to be replenished again. An advantage of the methods of the present invention is that instead of preparing new adhesion promoting baths weekly, a bath may be replenished and kept operational for 4 weeks or more.

When the present invention is used to replenish adhesion promotion baths containing a source of halide ions, it is preferred that the source of halide ions also be replenished after an extended shut down. Such additional halide ion source may be added before, during, or after the corrosion inhibitor. In the alternative, the halide ion source and corrosion inhibitor may be combined and the mixture used to replenish the bath. The halide ion source is typically added in an amount sufficient to bring the halide ion content up to working bath levels.

The micro-roughened and conversion coated surface provided by the baths of the present invention provides good adhesion to an adjacent polymeric coating, for example, an epoxy bonded fiber glass resin of an adjacent insulating dielectric layer.

After contact of the substrate surface, such as a copper surface, with the adhesion promoter to form the micro-roughened conversion coated surface, generally a pre-preg layer may be placed directly adjacent to the copper surface and the pre-preg layer adhered directly to the copper surface in the adhesion step thereby forming a multilayer printed circuit board. Generally, in the adhesion step, heat is applied to initiate the adhesion reaction. In the adhesion step, mechanical bonding is believed to be due to penetration of the polymer of the insulating layer into the micro-roughened surface provided in the adhesion promotion step. As an alternative to the pre-preg layer, the polymeric material may be applied directly on top of the micro-roughened surface produced in the adhesion promotion step in the form of a polymeric photoresist, screen-resist solder mask or adhesive material.

In use, it is desirable to follow the adhesion promotion step with a rinse step. The treated surface is subsequently dried. In accordance with a preferred embodiment of the process, a polymeric material is subsequently adhered to the micro-roughened surface with a single rinse and drying step.

A pre-preg insulating layer may be applied directly to the micro-roughened surface and in the adhesion step, pressure is also applied by placing the layers which are to form the multilayer laminate of the printed circuit board or at least the innerlayer and outerlayer, in a press. Where pressure is applied, it is generally within a range of from 100 to 400 psi, preferably within the range of from 150 to 300 psi. The temperature will generally be 100° C. or greater, and more often, from 120° C. to 200° C. The adhesion step is generally carried out for a period of from 5 minutes to 3 hours, most usually from 20 minutes to 1 hour, but is for sufficient time and pressure and at a sufficiently high temperature to ensure good adhesion between layers. During the adhesion step, the partially cured polymeric material of the insulating layers which is generally an epoxy resin, tends to soften and wet the treated copper surface, prior to further reacting to become fully crosslinked, ensuring that the conductive pattern in the metal is substantially sealed between insulating layers and subsequent penetration of water and air is avoided. If desired, several layers may be placed together in the adhesion step to effect lamination of several layers in a single step to form the multilayered board.

The following examples are intended to illustrate further various aspects of the present invention, but are not intended to limit the scope of the invention in any aspect.

EXAMPLE 1

Comparative

An adhesion promoting bath was prepared for use in a horizontal machine in a commercial facility. The bath contained 3 to 6% by volume sulfuric acid, 3 to 4% by volume hydrogen peroxide, 8 to 10 g/L corrosion inhibitor and 10 to 20 ppm of an amine. The bath was prepared and production of printed wiring boards started one night and run continuously for 6 days. During this time, a replenishment solution of hydrogen peroxide and a replenishment solution of sulfuric acid, corrosion inhibitor and amine were added using a bleed and feed approach. On the sixth day, production was halted and the bath was shut down for 24 hours. On the seventh day, the bath was restarted, a replenishment solution of hydrogen peroxide, a replenishment solution of sulfuric acid, corrosion inhibitor and amine, and a replenishment solution of amine were added and production resumed after 20 minutes of allowing the bath to equilibrate. The resulting printing wiring boards had unacceptably light colored (maroon to light pink) innerlayers, as compared to boards produced prior to extended shut down. Production was halted and 50% of the adhesion promoting bath was discarded and 50% of a fresh bath was prepared and production was resumed. After replacing ½ of the bath, the resulting adhesion promoted printed wiring boards were sufficiently dark in color and had high peel strength.

EXAMPLE 2

An adhesion promoting bath was prepared for use in a horizontal machine in a commercial facility. The bath contained 3 to 6% by volume sulfuric acid, 3 to 4% by volume hydrogen peroxide, 8 to 10 g/L corrosion inhibitor and 10 to 20 ppm of an amine. The bath was prepared and production of printed wiring boards started one night and run continuously for 6 days. During this time, a replenishment solution of hydrogen peroxide and a replenishment solution of sulfuric acid, corrosion inhibitor and amine were added using a bleed and feed approach. On the sixth day, production was halted and the bath was shut down for 24 hours. On the seventh day, the bath restarted, a replenishment solution of hydrogen peroxide, a replenishment solution of sulfuric acid, corrosion inhibitor and amine, and a replenishment solution of amine were added. In addition, 1000 g of corrosion inhibitor as a solid was added to the bath after both replenishment solutions. After 20 minutes, production was restarted. The resulting boards were acceptably dark in color, but the coating was not uniform.

Thus, it can be seen that the addition of an extra amount of corrosion inhibitor after an extended bath shut down produced printed wiring boards having an acceptable color without the need to discard part or all of the bath.

EXAMPLE 3

The procedure of Example 2 was repeated except that the additional corrosion inhibitor was added as an acidic aqueous solution. The restarted and replenished bath was operated for 6 days, shut down a second time for 24 hours, and restarted and replenished again. Production was again restarted and the resulting printed wiring boards were acceptably dark in color and had high peel strength.

Thus, the present invention may be used to extend the life of adhesion promoting baths for a number of weeks through multiple extended shut downs without the need to discard the bath.

EXAMPLE 4

The procedure of Example 3 was repeated except that after the addition of the replenishment corrosion inhibitor, additional amine was added. The amine was added in an amount to give a ratio of corrosion inhibitor to amine of 194:1. The restarted and replenished bath was operated for 6 days, shut down a second time for 24 hours, and restarted and replenished again. Production was again restarted and the resulting printed wiring boards were acceptably dark in color and had high peel strength.

Thus, the present invention may be used to extend the life of adhesion promoting baths for a number of weeks through multiple extended shut downs without the need to discard the bath.

What is claimed is:

1. A method of replenishing an adhesion promoting bath comprising acid, oxidizer, corrosion inhibitor and optionally, one or more additional components selected from the group consisting of amines, surfactants, stabilizers for the oxidant, water soluble polymers and sources of halide ions, after an extended shut down of 6 hours or longer, comprising the steps of first adjusting the concentration of the acid, the oxidant, the corrosion inhibitor and the one or more optional components to working levels and then adding an additional amount of corrosion inhibitor sufficient to provide a replenished adhesion promoting bath providing conversion coated substrate surfaces having brown or dark brown color and not having reduced peel strength as compared to conversion coated substrate surfaces treated just prior to such extended shut down.

2. The method of claim 1 wherein the corrosion inhibitor is selected from the group consisting of triazoles, benzotriazoles, tetrazoles, imidazoles, benzimidazoles and mixtures thereof.

3. The method of claim 2 wherein the corrosion inhibitor is benzotriazole.

4. The method of claim 1 wherein the acid is selected from the group consisting of sulfuric acid, nitric acid, phosphoric acid, and hydrochloric acid.

5. The method of claim 1 wherein the oxidant is hydrogen peroxide.

6. The method of claim 1 wherein the one or more additional components are selected from the group consisting of amines, surfactants, and sources of halide ions.

7. The method of claim 6 wherein the one or more additional compounds are selected from the group consisting of methylamine, dimethylamine, trimethylamine, ethylamine, triethylamine, tripropylamine, i-propylamine, triallylamine, n-butylamine, t-butylamine, n-amylamine, cyclohexylamine, dicyclohexylamine, tetramethylammonium hydroxide, tetraethylammonium hydroxide, dimethyl diethylammonium hydroxide, tetrabutylammonium hydroxide, tetramethylammonium chloride, tetraethylammonium chloride, dimethyl diethylammonium chloride, tetrabutylammonium chloride, isotridecyloxypropyl dihydroxyethyl methyl ammonium chloride, sodium chloride, potassium chloride, sodium chlorate, potassium chlorate and hydrochloric acid.

8. The method of claim 1 further comprising the step of adding one or more additional components selected from the group consisting of amines, surfactants, and sources of halide ions, before, during or after the addition of corrosion inhibitor.

9. A method for providing a micro-roughened conversion coated metal surface comprising contacting the metal surface with the replenished adhesion promoting bath of claim 1.

10. The method of claim 1 wherein the additional amount of corrosion inhibitor is sufficient to provide 8 to 12 grams per liter of corrosion inhibitor in the bath.

11. The method of claim 1 wherein the bath is shut down for 12 to 24 hours.

12. The method of claim 1 wherein the additional amount of corrosion inhibitor is added to the bath in the form of an acidic solution.

13. The method of claim 1 wherein the adhesion promoting bath has a copper concentration of greater than 10 g/l prior to the shut down.

14. A method of replenishing an adhesion promoting bath after an extended shut down of 6 hours or longer, the bath comprising acid, oxidizer, corrosion inhibitor and optionally, one or more additional components selected from the group consisting of amines, surfactants, stabilizers for the oxidant, water soluble polymers and sources of halide ions, and greater than 10 g/l copper prior to the shut down, comprising the steps of first adjusting the concentration of the acid, the oxidant, the corrosion inhibitor and the one or more optional components to working levels and then adding an additional amount of corrosion inhibitor sufficient to provide a replenished adhesion promoting bath providing conversion coated substrate surfaces having brown or dark brown color and not having reduced peel strength as compared to conversion coated substrate surfaces treated just prior to such extended shut down.

* * * * *